(12) United States Patent
Liang

(10) Patent No.: US 11,366,240 B2
(45) Date of Patent: Jun. 21, 2022

(54) RADIATION DETECTION AND METHOD OF FABRICATING RADIATION DETECTOR

(71) Applicants: Beijing BOE Technology Development Co., Ltd., Beijing (CN); BOE Technology Group Co., Ltd., Beijing (CN)

(72) Inventor: Kui Liang, Beijing (CN)

(73) Assignees: Beijing BOE Technology Development Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 125 days.

(21) Appl. No.: 16/761,858

(22) PCT Filed: Jun. 28, 2019

(86) PCT No.: PCT/CN2019/093830
§ 371 (c)(1),
(2) Date: May 6, 2020

(87) PCT Pub. No.: WO2020/258282
PCT Pub. Date: Dec. 30, 2020

(65) Prior Publication Data
US 2021/0405216 A1    Dec. 30, 2021

(51) Int. Cl.
*G01T 1/20* (2006.01)
*G01T 1/24* (2006.01)
*H01L 27/146* (2006.01)

(52) U.S. Cl.
CPC .......... *G01T 1/2018* (2013.01); *G01T 1/2002* (2013.01); *G01T 1/241* (2013.01); *H01L 27/14663* (2013.01); *H01L 27/14689* (2013.01)

(58) Field of Classification Search
CPC ..... G01T 1/2018; G01T 1/2002; G01T 1/241; H01L 27/14663; H01L 27/14689
See application file for complete search history.

(56) References Cited

U.S. PATENT DOCUMENTS

| 2003/0038241 | A1* | 2/2003 | Choo | H01L 27/1214 250/370.09 |
| 2004/0147054 | A1* | 7/2004 | Haberern | H01L 33/145 438/39 |
| 2007/0232011 | A1* | 10/2007 | Gogoi | H01L 27/0805 438/381 |

(Continued)

*Primary Examiner* — Blake C Riddick
(74) *Attorney, Agent, or Firm* — Intellectual Valley Law, P.C.

(57) ABSTRACT

A radiation detector having a plurality of pixels is provided. A respective one of the plurality of pixels includes a thin film transistor on a base substrate; an inter-layer dielectric layer on a side of the thin film transistor away from the base substrate; a sensing electrode and a bias electrode on a side of the inter-layer dielectric layer away from the base substrate, wherein the sensing electrode extends through the inter-layer dielectric layer to electrically connect to the thin film transistor; a passivation layer on a side of the sensing electrode and the bias electrode away from the inter-layer dielectric layer, wherein the passivation layer includes a first portion and a second portion; and a radiation detection layer on a side of the passivation layer away from the base substrate. The first portion and the second portion form a substantially flat contacting surface.

20 Claims, 12 Drawing Sheets

(56) References Cited

U.S. PATENT DOCUMENTS

2010/0207033 A1* 8/2010 Chen .................... H01L 31/085
  250/370.11
2019/0187305 A1* 6/2019 Yi .......................... G01T 1/247

* cited by examiner

RADIATION DETECTION AND METHOD OF FABRICATING RADIATION DETECTOR

CROSS-REFERENCE TO RELATED APPLICATION

This application is a national stage application under 35 U.S.C. § 371 of International Application No. PCT/CN2019/093830, filed Jun. 28, 2019, the contents of which are incorporated by reference in the entirety.

TECHNICAL FIELD

The present invention relates to display technology, more particularly, to a radiation detector and a method of fabricating a radiation detector.

BACKGROUND

A direct conversion radiation detector typically includes a radiation receiver, a processor, and a power supply. Typically, the radiation receiver has a scintillation layer made of $Gd_2O_2S$ or CsI, a large-area amorphous silicon sensor array, and a readout circuit. The scintillation layer converts the radiation (e.g., X-ray photons) to visible light. The large-scale integrated amorphous silicon sensor array then converts the visible light into electrons, which are then digitized by the readout circuit. The digitized signal is transmitted to a computer for image display.

An indirect conversion radiation detector typically includes a scintillation layer made of $Gd_2O_2S$ or CsI, a PIN photodiode, and a thin film transistor array. The scintillation layer converts the radiation (e.g., X-ray photons) into visible light. The PIN photodiode converts the visible light into electrical signals for image display.

SUMMARY

In one aspect, the present invention provides a radiation detector having a plurality of pixels, wherein a respective one of the plurality of pixels comprises a thin film transistor on a base substrate; an inter-layer dielectric layer on a side of the thin film transistor away from the base substrate; a sensing electrode and a bias electrode on a side of the inter-layer dielectric layer away from the base substrate, wherein the sensing electrode extends through the inter-layer dielectric layer to electrically connect to the thin film transistor; a passivation layer on a side of the sensing electrode and the bias electrode away from the inter-layer dielectric layer, wherein the passivation layer comprises a first portion and a second portion; and a radiation detection layer on a side of the passivation layer away from the base substrate; wherein the first portion comprises a first insulating material; the second portion comprises a second insulating material different from the first insulating material; and a first surface of the first portion away from the base substrate and a second surface of the second portion away from the base substrate are substantially co-planar, forming a substantially flat contacting surface.

Optionally, the second portion substantially covers an edge portion of the sensing electrode and substantially covers an edge portion of the bias electrode; the first portion substantially covers a non-edge portion of the sensing electrode substantially surrounded by the edge portion of the sensing electrode and substantially covers a non-edge portion of the bias electrode substantially surrounded by the edge portion of the bias electrode; and the first portion is not in direct contact with the edge portion of the sensing electrode and the edge portion of the bias electrode.

Optionally, the first portion and the second portion are complementary to each other.

Optionally, a cross-section of a part of the first portion along a plane perpendicular to the base substrate and the radiation detection layer has a substantially inverted trapezoidal shape; and a cross-section of a part of the second portion along the plane perpendicular to the base substrate and the radiation detection layer has a substantially trapezoidal shape.

Optionally, the first insulating material is an organic polymer insulating material; and the second insulating material is an inorganic insulating material.

Optionally, the first portion and the second portion together form a continuous insulating layer; and a height of a surface of the continuous insulating layer away from the base substrate relative to the base substrate is substantially uniform.

Optionally, an orthographic projection of the first portion on the base substrate at least partially overlaps with an orthographic projection of the sensing electrode on the base substrate and at least partially overlaps with an orthographic projection of the bias electrode on the base substrate.

Optionally, an orthographic projection of the second portion on the base substrate completely covers an orthographic projection of the sensing electrode on the base substrate and completely covers an orthographic projection of the bias electrode on the base substrate; the bias electrode is spaced apart from the first portion by the second portion; and the sensing electrode is spaced apart from the first portion by the second portion.

Optionally, the second portion substantially covers an inter-electrode region between the sensing electrode and the bias electrode.

Optionally, the sensing electrode and the bias electrode are interdigitated electrodes; branches of the sensing electrode and the bias electrode are alternately arranged; the first portion comprises interdigitated branches; orthographic projections of the sensing electrode and the bias electrode on the base substrate substantially cover an orthographic projection of the first portion on the base substrate; and the second portion covers an inter-electrode region between interdigitated branches of the first portion.

Optionally, the radiation detection layer is in direct contact with the first portion and in direct contact with the second portion; and the first surface of the first portion away from the base substrate and the second surface of the second portion away from the base substrate are substantially co-planar, forming the substantially flat contacting surface in direct contact with the radiation detection layer.

Optionally, the passivation layer further comprises a third portion on a side of the first portion and the second portion away from the base substrate; and the third portion is in direct contact with the radiation detection layer.

Optionally, the sensing electrode and the bias electrode have a thickness along a direction from the base substrate to the radiation detection layer greater than 75 nm.

Optionally, the first portion and the second portion have a thickness along a direction from the base substrate to the radiation detection layer in a range of 100 nm to 300 nm.

In another aspect, the present invention provides a method of fabricating a radiation detector having a plurality of pixels, wherein forming a respective one of the plurality of pixels comprises forming a thin film transistor on a base substrate; forming an inter-layer dielectric layer on a side of the thin film transistor away from the base substrate; forming a sensing electrode and a bias electrode on a side of the inter-layer dielectric layer away from the base substrate, wherein the sensing electrode extends through the inter-layer dielectric layer to electrically connect to the thin film transistor; forming a passivation layer on a side of the sensing electrode and the bias electrode away from the inter-layer dielectric layer, wherein forming the passivation layer comprises forming a first portion and forming a second portion; and forming a radiation detection layer on a side of the passivation layer away from the base substrate; wherein the first portion comprises a first insulating material; the second portion comprises a second insulating material different from the first insulating material; and a first surface of the first portion away from the base substrate and a second surface of the second portion away from the base substrate are substantially co-planar, forming a substantially flat contacting surface.

Optionally, forming the passivation layer comprises forming a second insulating material layer on a side of the sensing electrode and the bias electrode away from the base substrate; patterning the second insulating material layer to form the second portion, wherein a portion of the second insulating material layer is removed during patterning to expose a surface of the sensing electrode and a surface of the bias electrode; and forming a first insulating material layer on a side of the second portion away from the base substrate and covering the surface of the sensing electrode and the surface of the bias electrode exposed during patterning.

Optionally, the method further comprises reducing a thickness of the first insulating material layer to form the first portion.

Optionally, reducing the thickness of the first insulating material layer is performed so that a first surface of the first portion away from the base substrate and a second surface of the second portion away from the base substrate are substantially co-planar, forming the substantially flat contacting surface in direct contact with the radiation detection layer.

Optionally, the second portion is formed to cover an edge portion of the sensing electrode, an edge portion of the bias electrode, and an inter-electrode region between the sensing electrode and the bias electrode; and the portion of the second insulating material layer respectively corresponding to a non-edge portion of the sensing electrode substantially surrounded by the edge portion of the sensing electrode, and a non-edge portion of the bias electrode substantially surrounded by the edge portion of the bias electrode, is removed during patterning.

Optionally, forming the sensing electrode and the bias electrode comprises forming a conductive material layer on the inter-layer dielectric layer; and patterning the conductive material layer using a single mask plate to form interdigitated electrodes comprising the sensing electrode and the bias electrode; wherein branches of the sensing electrode and the bias electrode are alternately arranged; and forming the conductive material layer comprises depositing a conductive material on the inter-layer dielectric layer to a thickness along a direction from the inter-layer dielectric layer to the base substrate greater than 75 nm.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

In some embodiments, a radiation detector includes a sensing electrode S and a bias electrode B on an inter-layer dielectric layer, and a polyimide layer on the sensing electrode S and the bias electrode B. In the present disclosure, it is discovered that it is typically necessary to make the polyimide layer relative thin to allow carriers to pass through the polyimide layer at high electric charges. As a result, it also requires that the electrodes to be made relatively thin in order for them to be completely covered by the polyimide layer. It is discovered in the present disclosure that a radiation detector having a thin layer metal electrode is prone to defects such as bulge, oxidation, poor contact, and crack. These defects can further lead to short circuit and leak current in the dark state, affecting the performance of the radiation detector.

Accordingly, the present disclosure provides, inter alia, a radiation detector and a method of fabricating a radiation detector that substantially obviate one or more of the problems due to limitations and disadvantages of the related art. In one aspect, the present disclosure provides a radiation detector having a plurality of pixels. In some embodiment, a respective one of the plurality of pixels of the radiation detector includes a thin film transistor on a base substrate; an inter-layer dielectric layer on a side of the thin film transistor away from the base substrate; a sensing electrode and a bias electrode on a side of the inter-layer dielectric layer away from the base substrate, wherein the sensing electrode extends through the inter-layer dielectric layer to electrically connect to the thin film transistor; a passivation layer on a side of the sensing electrode and the bias electrode away from the inter-layer dielectric layer, wherein the passivation layer includes a first portion and a second portion; and a radiation detection layer on a side of the passivation layer away from the base substrate, wherein the radiation detection layer is in direct contact with the first portion and in direct contact with the second portion. Optionally, the first portion includes a first insulating material; and the second portion includes a second insulating material different from the first insulating material. Optionally, a first surface of the first portion away from the base substrate and a second surface of the second portion away from the base substrate are substantially co-planar, forming a substantially flat contacting surface in direct contact with the radiation detection layer.

Figure 1:
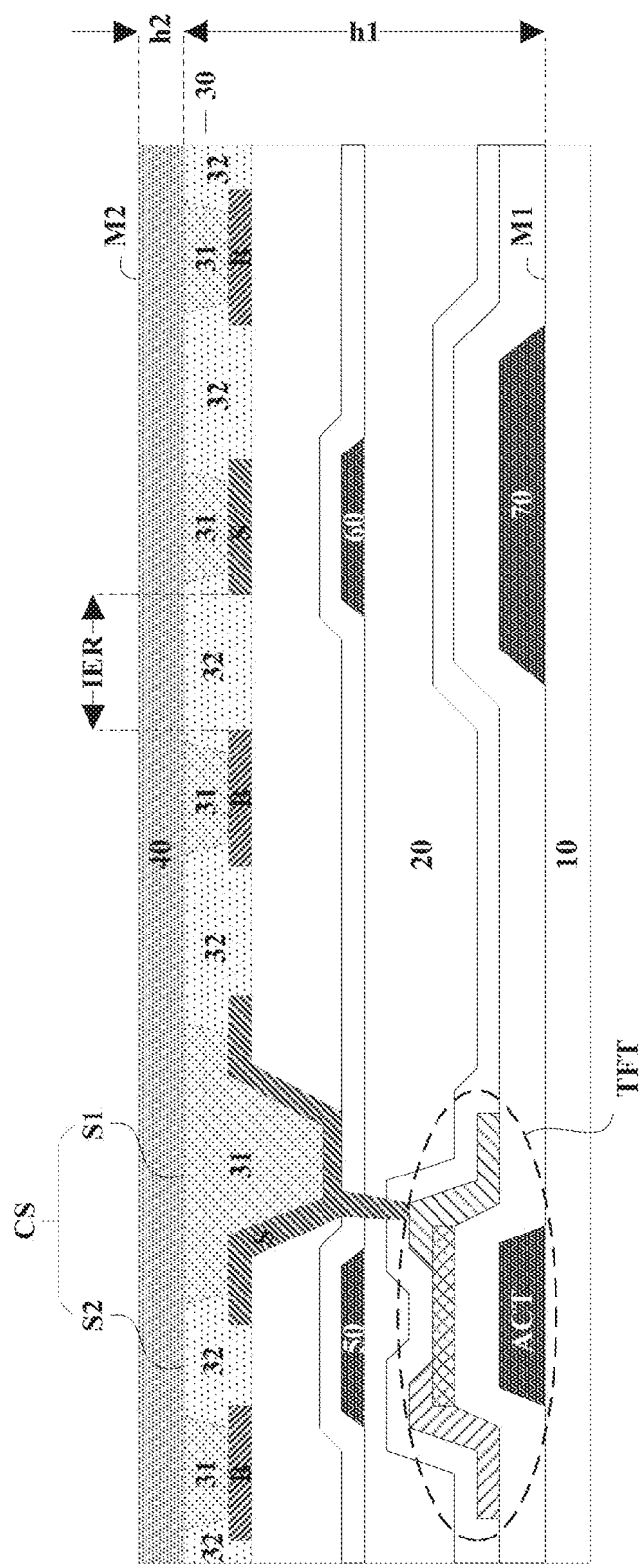
FIG. 1 is a cross-sectional view of a pixel of a radiation detector in some embodiments according to the present disclosure.

FIG. 1 is a cross-sectional view of a pixel of a radiation detector in some embodiments according to the present disclosure. Referring to FIG. 1, the respective one of the plurality of pixels of the radiation detector includes a thin film transistor TFT on a base substrate 10; an inter-layer dielectric layer 20 on a side of the thin film transistor TFT away from the base substrate 10; a sensing electrode S and a bias electrode B on a side of the inter-layer dielectric layer 20 away from the base substrate 10; a passivation layer 30 on a side of the sensing electrode S and the bias electrode B away from the inter-layer dielectric layer 20; and a radiation detection layer 40 on a side of the passivation layer 30 away from the base substrate 10. Optionally, the passivation layer 30 includes a first portion 31 and a second portion 32. Optionally, the radiation detection layer 40 is in direct contact with the first portion 31 and in direct contact with the second portion 32. Optionally, the first portion 31 includes a first insulating material; and the second portion 32 includes a second insulating material different from the first insulating material. Optionally, a first surface S1 of the first portion 31 away from the base substrate 10 and a second surface S2 of the second portion 32 away from the base substrate are substantially co-planar, forming a substantially flat contacting surface CS in direct contact with the radiation detection layer 40. Optionally, the sensing electrode S extends through the inter-layer dielectric layer 20 to electrically connect to the thin film transistor TFT.

As used herein, the term "substantially co-planar" refers to two or more surfaces on a structure sharing a same common plane or being offset no more than 100 nm (e.g., no more than 90 nm, no more than 80 nm, no more than 70 nm, no more than 60 nm, no more than 50 nm, no more than 40 nm, no more than 30 nm, no more than 20 nm, no more than 10 nm, no more than 5 nm, or no more than 1 nm) from sharing the same common plane. Optionally, the term "substantially co-planar" refers to two or more surfaces on a structure sharing a same common plane or being offset no more than 20 nm from sharing the same common plane.

As used herein, the term "substantially flat contacting surface" refers to a flat surface (for example, entirely planar across the surface) or a surface having micro-irregularities (for example, minor variations and/or deviations from flat surface geometries). Optionally, the deviation from the flat surface geometries is no more than 100 nm (e.g., no more than 90 nm, no more than 80 nm, no more than 70 nm, no more than 60 nm, no more than 50 nm, no more than 40 nm, no more than 30 nm, no more than 20 nm, no more than 10 nm, no more than 5 nm, or no more than 1 nm). Optionally, the deviation from the flat surface geometries is no more than 20 nm.

In some embodiments, the first portion 31 and the second portion 32 together form a continuous insulating layer. Optionally, a height h1 of the substantially flat contacting surface CS of the continuous insulating layer relative to the base substrate 10 (e.g., relative to a main surface M1 of the base substrate 10 facing the radiation detection layer 40) is substantially uniform. Optionally, a height h2 of the substantially flat contacting surface CS of the continuous insulating layer relative to the radiation detection layer 40 (e.g., relative to a main surface M2 of the radiation detection layer 40 facing away from the base substrate 10) is substantially uniform. As used herein the term "substantially uniform" refers to a variation of a parameter no more than a threshold value. In the context of a height of a component, the term "substantially uniform" refers to a variation of the height is no more than 100 nm, e.g., no more than 90 nm, no more than 80 nm, no more than 70 nm, no more than 60 nm, no more than 50 nm, no more than 40 nm, no more than 30 nm, no more than 20 nm, no more than 10 nm, no more than 5 nm, or no more than 1 nm.

Figure 2:
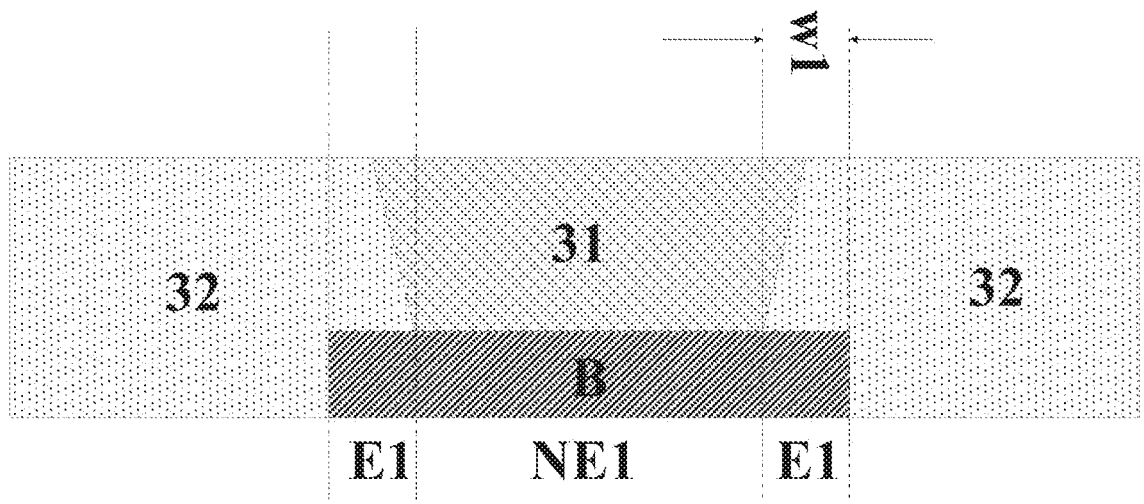
FIG. 2 is a zoom-in view of a contacting interface between a bias electrode and the passivation layer in a radiation detector in some embodiments according to the present disclosure.
Figure 3:
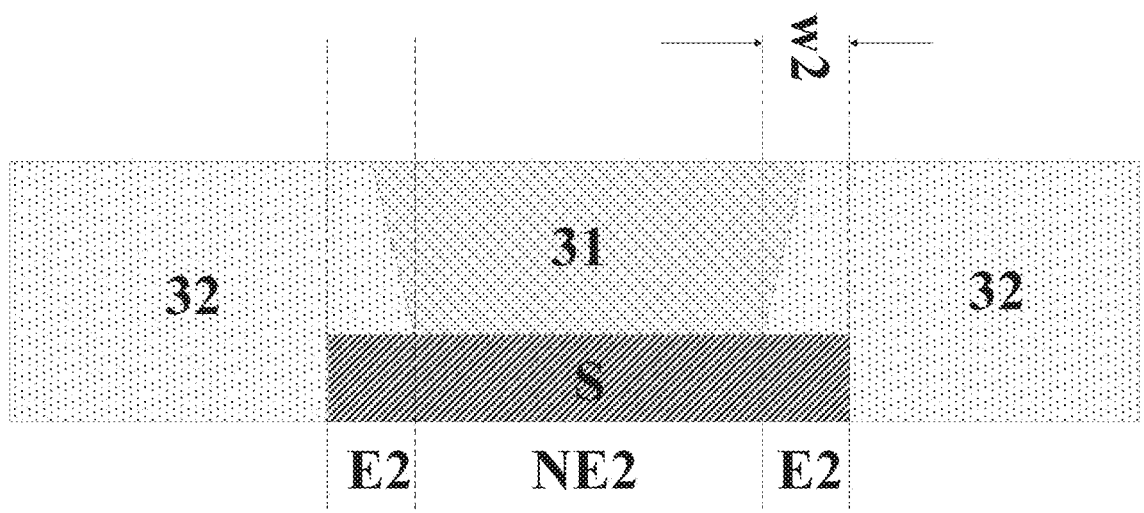
FIG. 3 is a zoom-in view of a contacting interface between a sensing electrode and the passivation layer in a radiation detector in some embodiments according to the present disclosure.

FIG. 2 is a zoom-in view of a contacting interface between a bias electrode and the passivation layer in a radiation detector in some embodiments according to the present disclosure. FIG. 3 is a zoom-in view of a contacting interface between a sensing electrode and the passivation layer in a radiation detector in some embodiments according to the present disclosure. Referring to FIGS. 1 to 3, in some embodiments, the second portion 32 substantially covers an edge portion E2 of the sensing electrode S and substantially covers an edge portion E1 of the bias electrode B. As shown in FIG. 2, the edge portion E1 of the bias electrode B covered by the second portion 32 has a first width w1 along a direction of the edge portion E1 to a non-edge portion NE1. Optionally, the first width w1 is equal to or greater than 1 μm, e.g., equal to or greater than 2 μm, equal to or greater than 3 μm, equal to or greater than 4 μm, equal to or greater than 5 μm, equal to or greater than 6 μm, equal to or greater than 7 μm, equal to or greater than 8 μm, equal to or greater than 9 µm, or equal to or greater than 10 µm. Optionally, the first width w1 is between 1 µm and 2 µm. As shown in FIG. 3, the edge portion E2 of the sensing electrode S covered by the second portion 32 has a second width w2 along a direction of the edge portion E2 to a non-edge portion NE2. Optionally, the second width w2 is equal to or greater than 1 µm, e.g., equal to or greater than 2 µm, equal to or greater than 2 µm, equal to or greater than 3 µm, equal to or greater than 4 µm, equal to or greater than 5 µm, equal to or greater than 6 µm, equal to or greater than 7 µm, equal to or greater than 8 µm, equal to or greater than 9 µm, or equal to or greater than 10 µm. Optionally, the second width w2 is between 1 µm and 2 µm.

Referring to FIGS. 1 to 3, in some embodiments, the first portion 31 substantially covers a non-edge portion NE2 of the sensing electrode S substantially surrounded by the edge portion E2 of the sensing electrode S and substantially covers a non-edge portion NE1 of the bias electrode substantially surrounded by the edge portion E1 of the bias electrode B. Optionally, the first portion 31 is not in direct contact with the edge portion E2 of the sensing electrode S and the edge portion E1 of the bias electrode B.

Referring to FIGS. 1 to 3, in some embodiments, an orthographic projection of the first portion 31 on the base substrate 10 at least partially overlaps with an orthographic projection of the sensing electrode S on the base substrate 10 and at least partially overlaps with an orthographic projection of the bias electrode B on the base substrate 10. Optionally, an orthographic projection of the second portion 32 on the base substrate 10 is at least partially non-overlapping with the sensing electrode S on the base substrate 10 and is least partially non-overlapping with an orthographic projection of the bias electrode B on the base substrate 10. Optionally, the second portion 32 substantially covers an inter-electrode region TER between the sensing electrode S and the bias electrode B.

Figure 7:
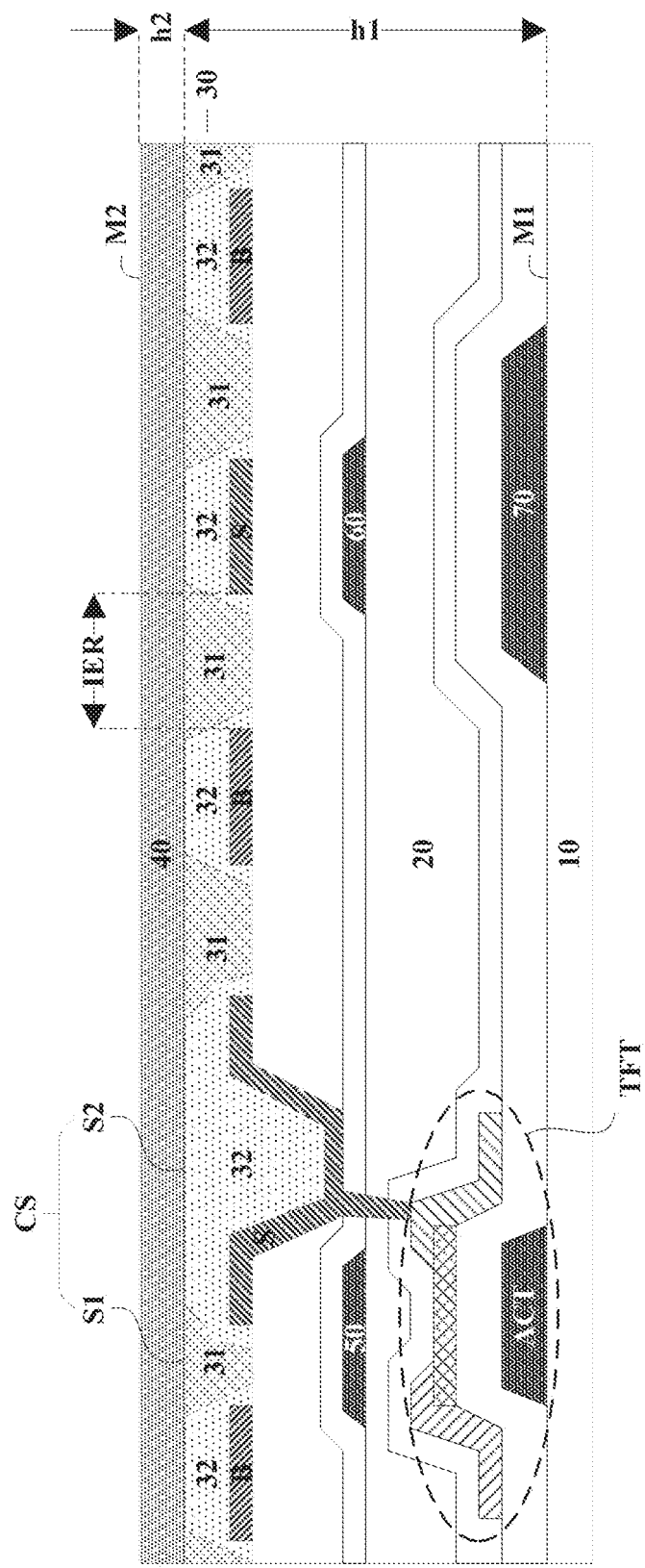
FIG. 7 is a cross-sectional view of a pixel of a radiation detector in some embodiments according to the present disclosure.
Figure 8:
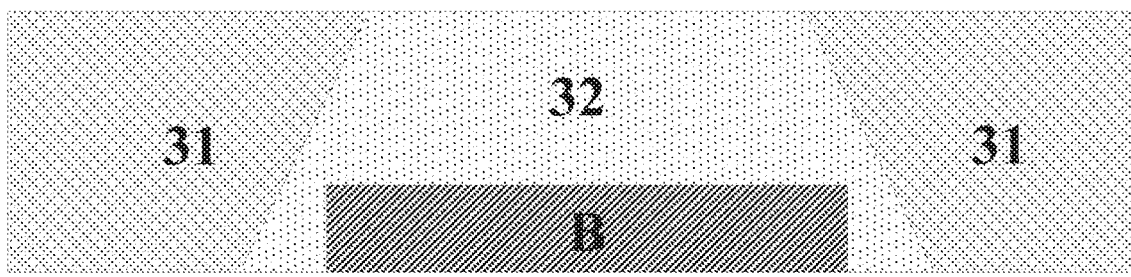
FIG. 8 is a zoom-in view of a contacting interface between a bias electrode and the passivation layer in a radiation detector in some embodiments according to the present disclosure.
Figure 9:
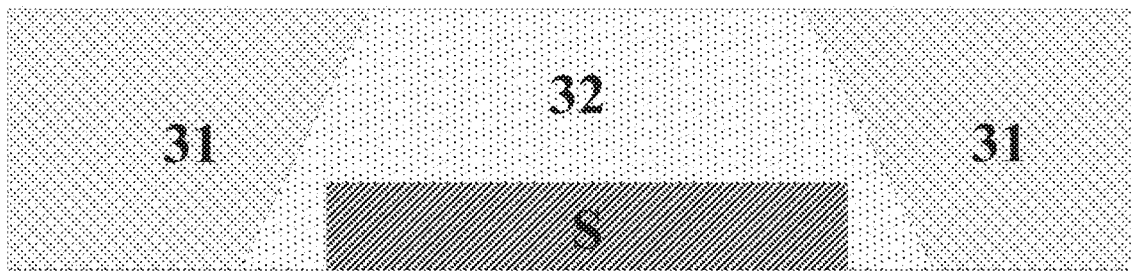
FIG. 9 is a zoom-in view of a contacting interface between a sensing electrode and the passivation layer in a radiation detector in some embodiments according to the present disclosure.

FIG. 7 is a cross-sectional view of a pixel of a radiation detector in some embodiments according to the present disclosure. FIG. 8 is a zoom-in view of a contacting interface between a bias electrode and the passivation layer in a radiation detector in some embodiments according to the present disclosure. FIG. 9 is a zoom-in view of a contacting interface between a sensing electrode and the passivation layer in a radiation detector in some embodiments according to the present disclosure. Referring to FIGS. 7 to 9, in some embodiments, the second portion 32 completely covers the bias electrode B. For example, an orthographic projection of the second portion 32 on the base substrate 10 completely covers an orthographic projection of the bias electrode B on the base substrate 10. Optionally, the bias electrode B is not in direct contact with the first portion 31, e.g., the bias electrode B is spaced apart from the first portion 31 by the second portion 32. In some embodiments, the second portion 32 completely covers the sensing electrode S. For example, an orthographic projection of the second portion 32 on the base substrate 10 completely covers an orthographic projection of the sensing electrode S on the base substrate 10. Optionally, the sensing electrode S is not in direct contact with the first portion 31, e.g., the sensing electrode S is spaced apart from the first portion 31 by the second portion 32.

Referring to FIGS. 7 to 9, in some embodiments, an orthographic projection of the first portion 31 on the base substrate TO partially overlaps with an orthographic projection of the sensing electrode S on the base substrate 10 and partially overlaps with an orthographic projection of the bias electrode B on the base substrate 10. Optionally, the second portion 32 is partially in an inter-electrode region IER between the sensing electrode S and the bias electrode B.

As discussed above, and referring to FIGS. 1 to 12, the first portion 31 and the second portion 32 of the passivation layer 30 are made of different materials. In some embodiments, the first portion 31 is made of a first insulating material, and the second portion 32 is made of a second insulating material. Various appropriate insulating materials and various appropriate fabricating methods may be used to make the first portion 31 and the second portion 32. For example, an insulating material may be deposited on the substrate by a plasma-enhanced chemical vapor deposition (PECVD) process.

In some embodiments, the first insulating material is an organic insulating material, and the second insulating material is an inorganic insulating material. Optionally, the first insulating material is an insulating material that allows carriers to pass through at high electric charges and is substantially insulating at low electric charges. Examples of appropriate insulating materials for making the first portion 31 include, but are not limited to, various organic polymers such as polyimide. Optionally, the second insulating material is an insulating material that can be evenly deposited on a surface. Examples of appropriate insulating materials for making the second portion 32 include, but are not limited to, silicon oxide ($SiO_y$), silicon nitride ($SiN_y$, e.g., $Si_3N_4$), and silicon oxynitride ($SiO_xN_y$).

In some embodiments, the first insulating material is an inorganic insulating material, and the second insulating material is an organic insulating material. Optionally, the first insulating material is an insulating material that can be evenly deposited on a surface. Examples of appropriate insulating materials for making the first portion 31 include, but are not limited to, silicon oxide ($SiO_y$), silicon nitride ($SiN_y$, e.g., $Si_3N_4$), and silicon oxynitride ($SiO_xN_y$). Optionally, the second insulating material is an insulating material that allows carriers to pass through at high electric charges and is substantially insulating at low electric charges. Examples of appropriate insulating materials for making the second portion 32 include, but are not limited to, various organic polymers such as polyimide.

The first portion 31 and the second portion 32 may be made of any appropriate shapes or dimensions. In some embodiments, as shown in FIGS. 1-3, and 7-9, a cross-section of a part (e.g., a branch or a finger) of the first portion 31, along a plane perpendicular to the base substrate 10 and the radiation detection layer 40 (optionally crossing over branches of sensing electrodes and bias electrodes) has a substantially inverted trapezoidal shape. In some embodiments, a cross-section of a part (e.g., a branch or a finger) of the second portion 32 along the plane perpendicular to the base substrate 10 and the radiation detection layer 40 (optionally crossing over branches of sensing electrodes and bias electrodes) has a substantially trapezoidal shape.

As used herein, "substantially trapezoidal shape" or "substantially inverted trapezoidal shape" can include shapes or geometries having one pair of substantially parallel sides and one pair of substantially non-parallel sides, regardless of whether the substantially parallel sides or the substantially non-parallel sides include straight lines or curved lines. As used herein, the term "substantially parallel sides" refers to two sides forming an included angle in a range of 0 degree to 15 degrees, e.g., 0 degree to 1 degree, 1 degree to 2 degrees, 2 degree to 5 degrees, 5 degree to 10 degrees, or 10 degrees to 15 degrees. As used herein, the term "substantially non-parallel sides" refers to two sides forming an included angle in a range of greater than 15 degrees.

Optionally, the pair of substantially parallel sides of the substantially trapezoidal shape includes a shorter side and a longer side, wherein the longer side is closer to the bottom side of the base substrate 10. Optionally, the pair of substantially parallel sides of the substantially inverted trapezoidal shape includes a shorter side and a longer side, wherein the shorter side is closer to the bottom side of the base substrate 10.

Figure 4:
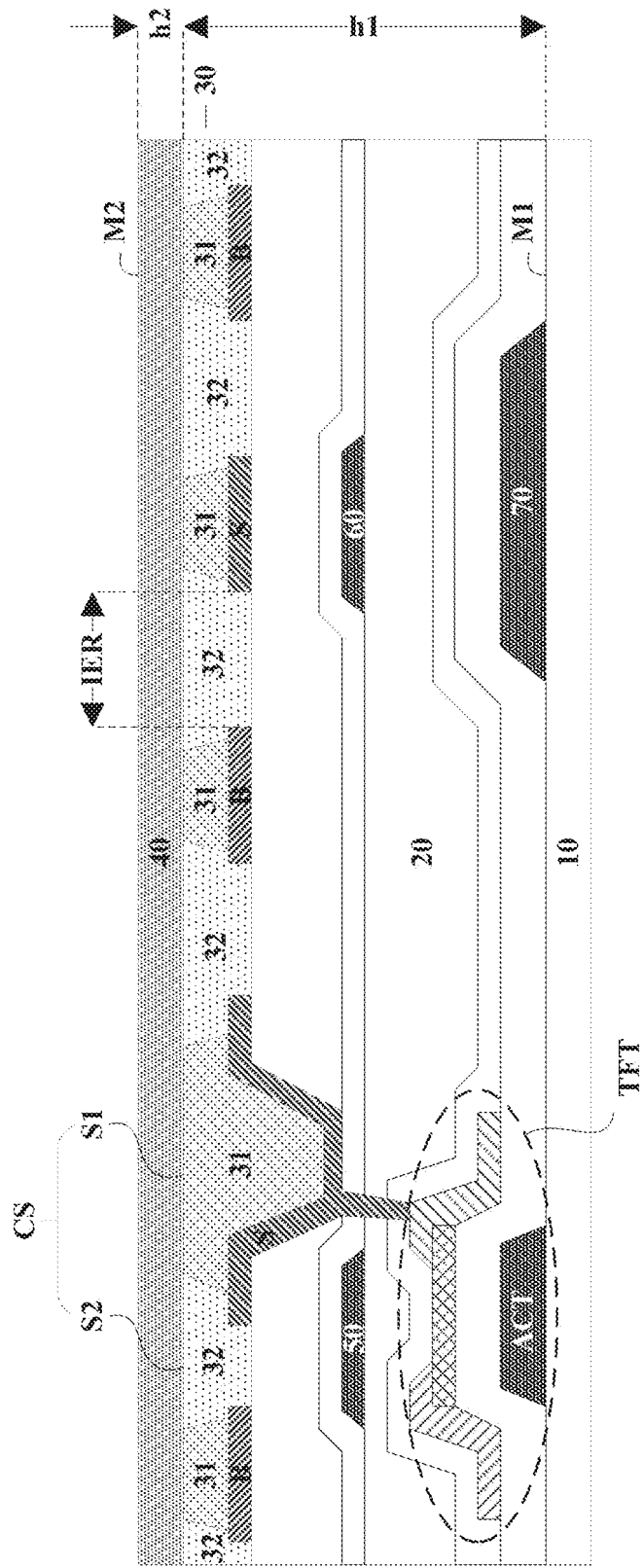
FIG. 4 is a cross-sectional view of a pixel of a radiation detector in some embodiments according to the present disclosure.
Figure 5:
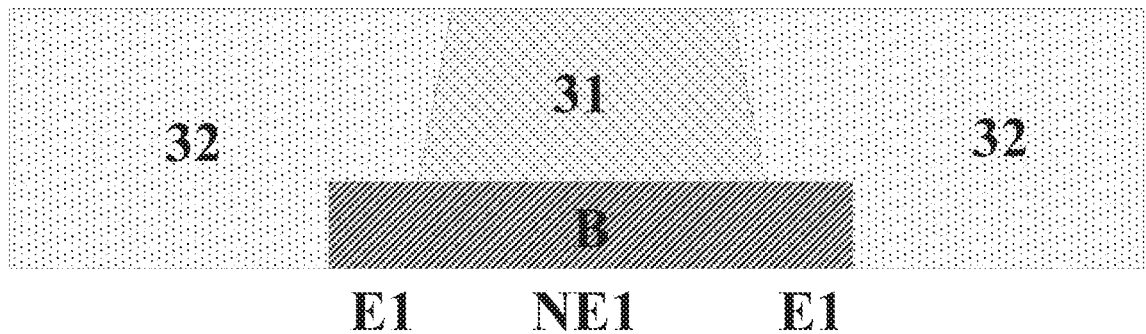
FIG. 5 is a zoom-in view of a contacting interface between a bias electrode and the passivation layer in a radiation detector in some embodiments according to the present disclosure.
Figure 6:
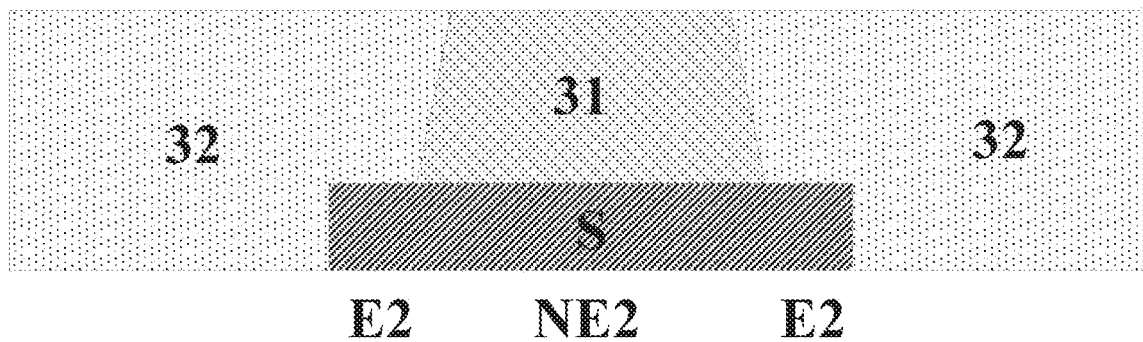
FIG. 6 is a zoom-in view of a contacting interface between a sensing electrode and the passivation layer in a radiation detector in some embodiments according to the present disclosure.
Figure 10:
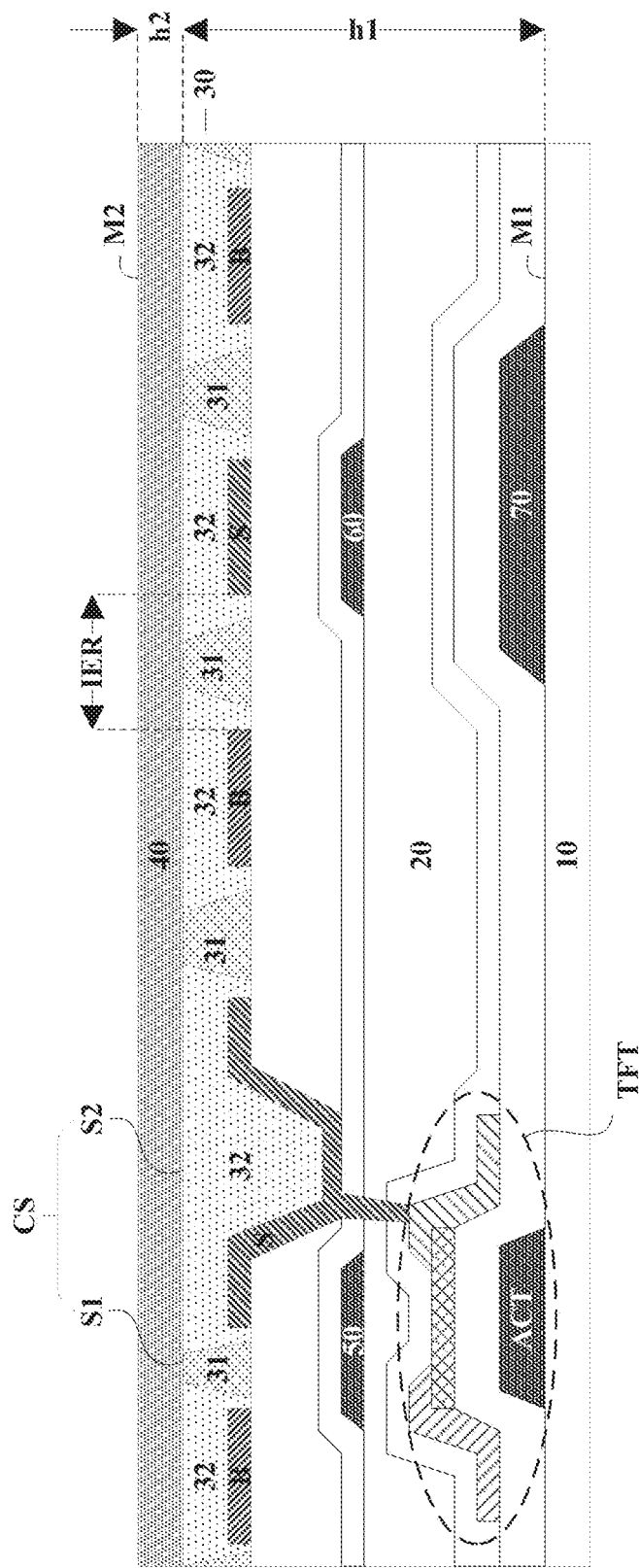
FIG. 10 is a cross-sectional view of a pixel of a radiation detector in some embodiments according to the present disclosure.
Figure 11:
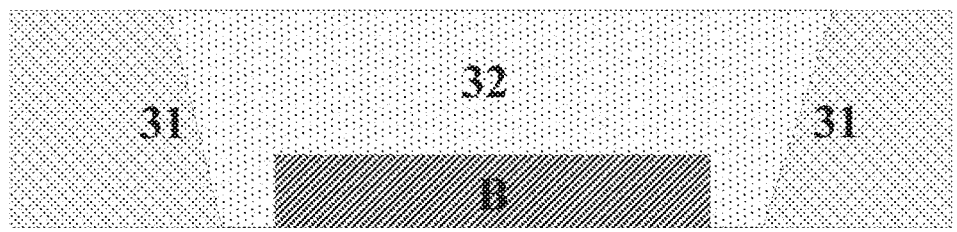
FIG. 11 is a zoom-in view of a contacting interface between a bias electrode and the passivation layer in a radiation detector in some embodiments according to the present disclosure.
Figure 12:
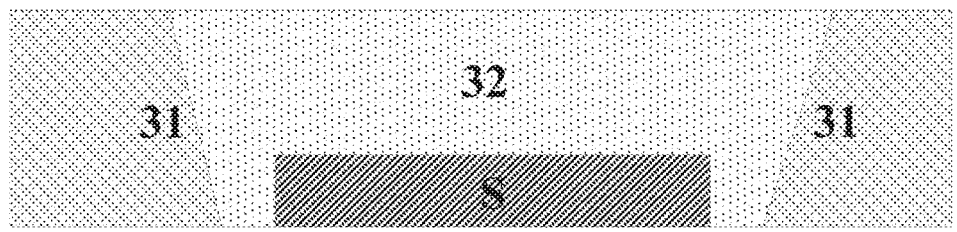
FIG. 12 is a zoom-in view of a contacting interface between a sensing electrode and the passivation layer in a radiation detector in some embodiments according to the present disclosure.

FIG. 4 is a cross-sectional view of a pixel of a radiation detector in some embodiments according to the present disclosure. FIG. 5 is a zoom-in view of a contacting interface between a bias electrode and the passivation layer in a radiation detector in some embodiments according to the present disclosure. FIG. 6 is a zoom-in view of a contacting interface between a sensing electrode and the passivation layer in a radiation detector in some embodiments according to the present disclosure. FIG. 10 is a cross-sectional view of a pixel of a radiation detector in some embodiments according to the present disclosure. FIG. 11 is a zoom-in view of a contacting interface between a bias electrode and the passivation layer in a radiation detector in some embodiments according to the present disclosure. FIG. 12 is a zoom-in view of a contacting interface between a sensing electrode and the passivation layer in a radiation detector in some embodiments according to the present disclosure. Referring to FIGS. 4-6, and 10-12, in some embodiments, a cross-section of a part (e.g., a branch or a finger) of the first portion 31, along a plane perpendicular to the base substrate 10 and the radiation detection layer 40 (optionally crossing over branches of sensing electrodes and bias electrodes) has a substantially trapezoidal shape. In some embodiments, a cross-section of a part (e.g., a branch or a finger) of the second portion 32 along the plane perpendicular to the base substrate 10 and the radiation detection layer 40 (optionally crossing over branches of sensing electrodes and bias electrodes) has a substantially inverted trapezoidal shape.

Various appropriate materials may be used for making the base substrate 10. Examples of materials suitable for making the base substrate 10 include, but are not limited to, glass, quartz, polyimide, and polyester, etc. Optionally, the base substrate 10 is a flexible base substrate (e.g., polyimide base substrate). Optionally, the base substrate 10 is a relatively inflexible base substrate (e.g., a glass base substrate).

Various appropriate electrode materials may be used for making the sensing electrode S and the bias electrode B. Examples of appropriate electrode materials for making the sensing electrode S and the bias electrode B include, but are not limited to, nano-silver, graphene, nano-carbon tube, molybdenum, aluminum, chromium, tungsten, titanium, tantalum, copper, and alloys or laminates containing the same. Various appropriate fabricating methods may be used for making the sensing electrode S and the bias electrode B. For example, an electrode material may be deposited on the substrate (e.g., by sputtering or vapor deposition or solution coating); and patterned (e.g., by lithography such as a wet etching process) to form the sensing electrode S and the bias electrode B. Optionally, the sensing electrode S and the bias electrode B may be spin coated on the substrate. Optionally, the sensing electrode S and the bias electrode B have a thickness in the range of 50 nm to 200 nm, e.g., 50 nm to 100 nm, 100 nm to 150 nm, or 150 nm to 200 nm. Optionally, each of the sensing electrode S and the bias electrode B has a thickness along a direction from the inter-layer dielectric layer 20 to the base substrate 10 greater than 75 nm.

Various appropriate insulating materials and various appropriate fabricating methods may be used to make the inter-layer dielectric layer 20. For example, an insulating material may be deposited on the substrate by a plasma-enhanced chemical vapor deposition (PECVD) process. Examples of appropriate insulating materials for making the inter-layer dielectric layer 20 include, but are not limited to, silicon oxide ($SiO_y$), silicon nitride ($SiN_y$, e.g., $Si_3N_4$), silicon oxynitride ($SiO_xN_y$), a resin, and polyimide.

Various appropriate insulating materials and various appropriate fabricating methods may be used to make the passivation layer 30. For example, an insulating material may be deposited on the substrate by a plasma-enhanced chemical vapor deposition (PECVD) process. Examples of appropriate insulating materials for making the passivation layer 30 include, but are not limited to, silicon oxide ($SiO_y$), silicon nitride ($SiN_y$, e.g., $Si_3N_4$), silicon oxynitride ($SiO_xN_y$), a resin, and polyimide.

Various appropriate radiation detection materials and various appropriate fabricating methods may be used to make the radiation detection layer 40. For example, a radiation detection material may be deposited on the substrate by a plasma-enhanced chemical vapor deposition (PECVD) process. Examples of appropriate radiation detection materials for making the radiation detection layer 40 include, but are not limited to, amorphous silicon (a-Si), poly-crystal silicon, amorphous selenium (a-Se), cadmium sulfide (CdS), cadmium telluride (CdTe), zinc oxide (ZnO), lead oxide (PbO), lead iodide ($PbI_2$), $Bi_{12}(Ge, Si)O_{20}$, or any combination thereof. Optionally, the radiation detection material for making the radiation detection layer 40 is a perovskite material. Optionally, the radiation detection material is an organic-inorganic lead halide perovskite material.

Figure 13:
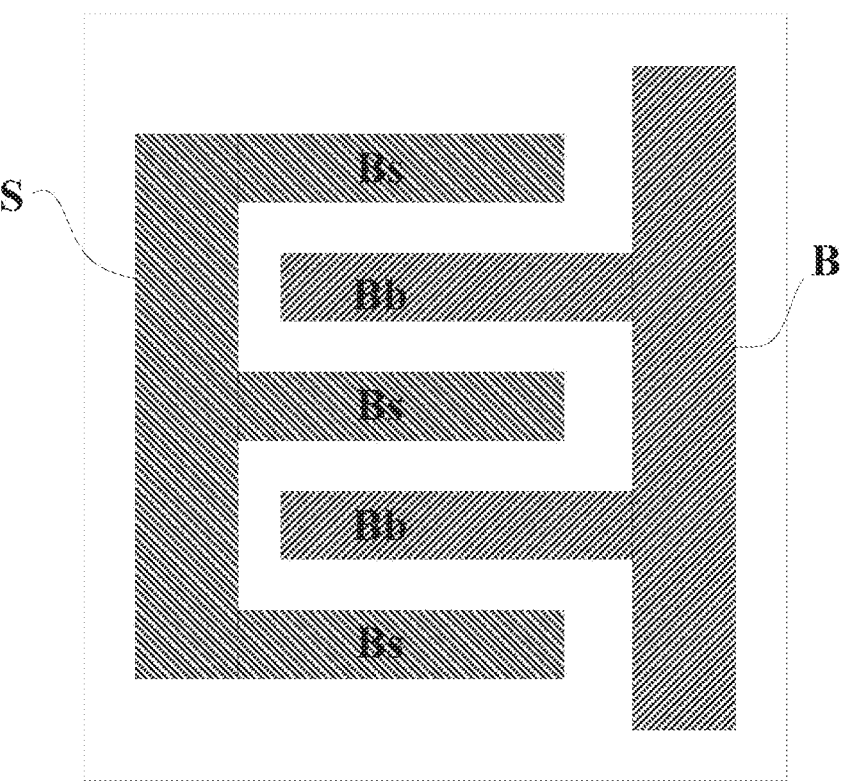
FIG. 13 is a plan view of a sensing electrode and a bias electrode in some embodiments according to the present disclosure.

The sensing electrode S and the bias electrode B may be made of various appropriate shapes. FIG. 13 is a plan view of a sensing electrode and a bias electrode in some embodiments according to the present disclosure. Referring to FIG. 13, in some embodiments, the sensing electrode S and the bias electrode B are interdigitated electrodes. As used herein, the term "interdigitated electrodes" indicates at least two electrodes, wherein "branches" or "fingers" of each electrode are disposed in an alternating fashion. For example, as shown in FIG. 13, a pair of comb-shaped interdigitated electrodes contain "branches" which are arranged in an alternating fashion with respect to one another. It should be understood that other shapes of electrodes may also be suitable for use as interdigitated electrode. Optionally, the interdigitated electrodes are at least two complementarily-shaped electrodes. As shown in FIG. 13, branches Bs of the sensing electrode S and branches Bb of the bias electrode B are alternately arranged. Optionally, branches Bs of the sensing electrode S and branches Bb of the bias electrode B are substantially parallel to each other.

Figure 14:
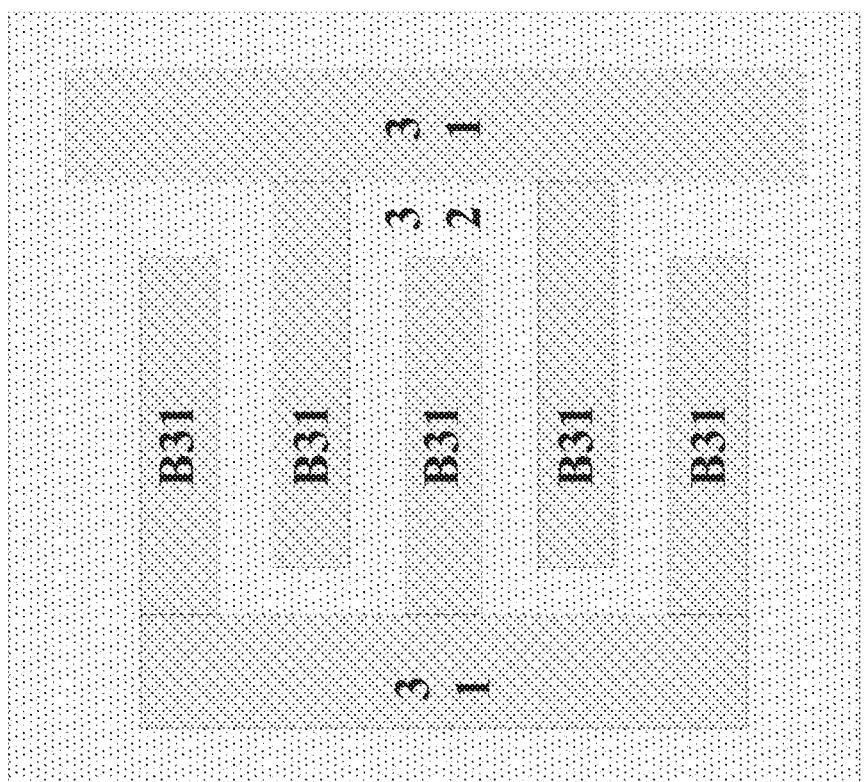
FIG. 14 is a plan view of a passivation layer in some embodiments according to the present disclosure.

FIG. 14 is a plan view of a passivation layer in some embodiments according to the present disclosure. Referring to FIG. 14, in some embodiments, the first portion 31 includes interdigitated branches B31. Referring to FIG. 14 and FIGS. 1 to 3, orthographic projections of the sensing electrode S and the bias electrode B on the base substrate 10 substantially cover an orthographic projection of the first portion 31 on the base substrate 10; and the second portion 32 covers an inter-electrode region IER between interdigitated branches B31 of the first portion 31.

Figure 15:
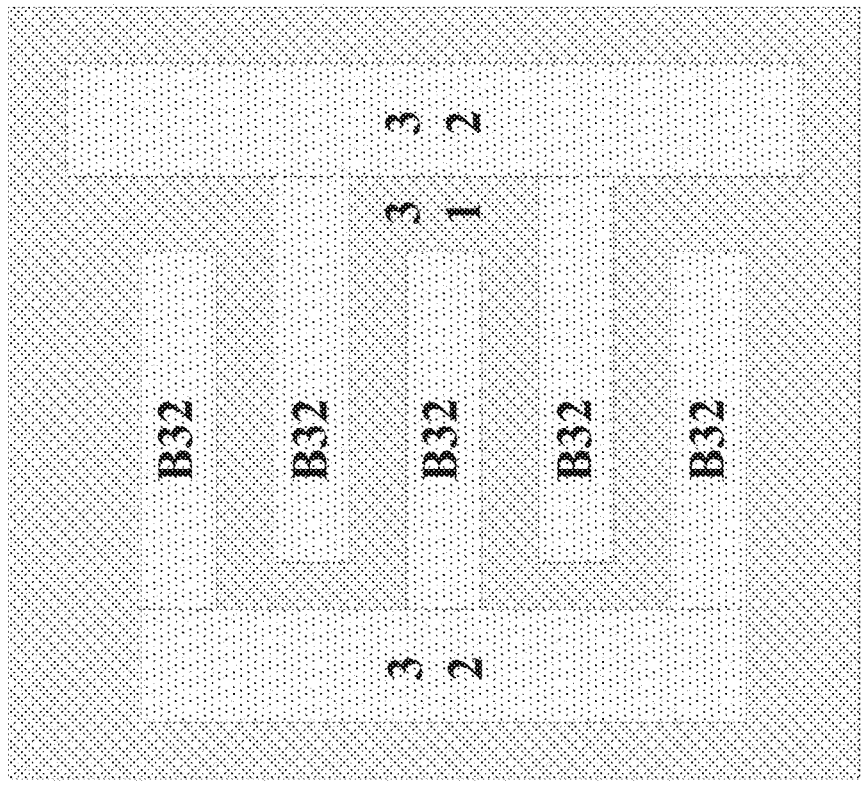
FIG. 15 is a plan view of a passivation layer in some embodiments according to the present disclosure.

FIG. 15 is a plan view of a passivation layer in some embodiments according to the present disclosure. Referring to FIG. 15, in some embodiments, the second portion 32 includes interdigitated branches B32. Referring to FIG. 15 and FIGS. 7 to 9, orthographic projections of the sensing electrode S and the bias electrode B on the base substrate 10 substantially cover an orthographic projection of the second portion 32 on the base substrate 10; and the first portion 31 covers an inter-electrode region IER between interdigitated branches B32 of the second portion 32.

As shown in FIG. 14 and FIG. 15, in some embodiments, the first portion 31 and the second portion 32 are complementary to each other. For example, the first portion 31 and the second portion 32, putting together, form an integral structure in which adjacent borders of first portion 31 and the second portion 32 are in direct contact with each other.

In the present radiation detector, because at least the edge portion of the sensing electrode S and at least the edge portion of the bias electrode B are covered by one of the first portion 31 and the second portion 32 that can be evenly deposited on the substrate, defects such as bulge, oxidation, poor contact, and crack can be obviated. Accordingly, the electrode layers (e.g., the sensing electrode S and the bias electrode B) can be made relatively thicker. Optionally, the sensing electrode S and the bias electrode B have a thickness along a direction from the base substrate 10 to the radiation detection layer 40 greater than 75 nm, e.g., 75 nm to 100 nm, or greater than 100 nm. Because the problems due to the electrode layer are obviated in the present radiation detector, the passivation layer 30 (including the first portion 31 and the second portion 32) may be made relatively thicker. Optionally, the first portion 31 and the second portion 32 has a thickness along a direction from the base substrate 10 to the radiation detection layer 40 in a range of 100 nm to 300 nm, e.g., 100 nm to 200 nm, or 200 nm to 300 nm.

Referring to FIGS. 1, 4, 7, and 10, the radiation detector in some embodiments further includes a light shielding layer 50 configured to at least partially shield light from irradiating on an active layer ACT of the thin film transistor TFT. In some embodiments, the radiation detector further includes a plurality of signal lines (e.g., a first signal line 60 and a second signal line 70).

Figure 16:
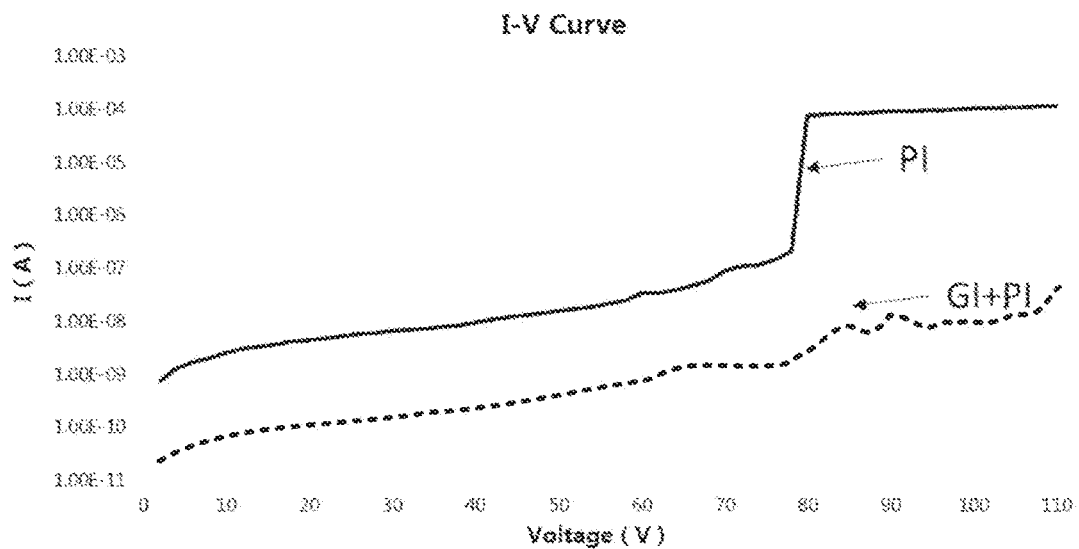
FIG. 16 compares dark currents respectively in a convention radiation detector and a radiation detector in some embodiments according to the present disclosure.

FIG. 16 compares dark currents respectively in a convention radiation detector and a radiation detector in some embodiments according to the present disclosure. Referring to FIG. 16, the PI curve indicates a dark current in a conventional radiation detector in which the passivation layer is entirely made of a polyimide material; the GI+PI curve indicates a dark current in a radiation detector according to the present disclosure in which the passivation layer includes a first portion made of polyimide and a second portion made of silicon nitride. In both the convention radiation detector and the radiation detector according to the present disclosure, the electrodes have a thickness about 50 nm. As shown in FIG. 16, the dark current in the radiation detector according to the present disclosure is significantly lower as compared to that in the convention radiation detector. Moreover, the electrical breakdown voltage of the passivation layer in the radiation detector according to the present disclosure is significantly higher than that in the convention radiation detector.

Figure 17:
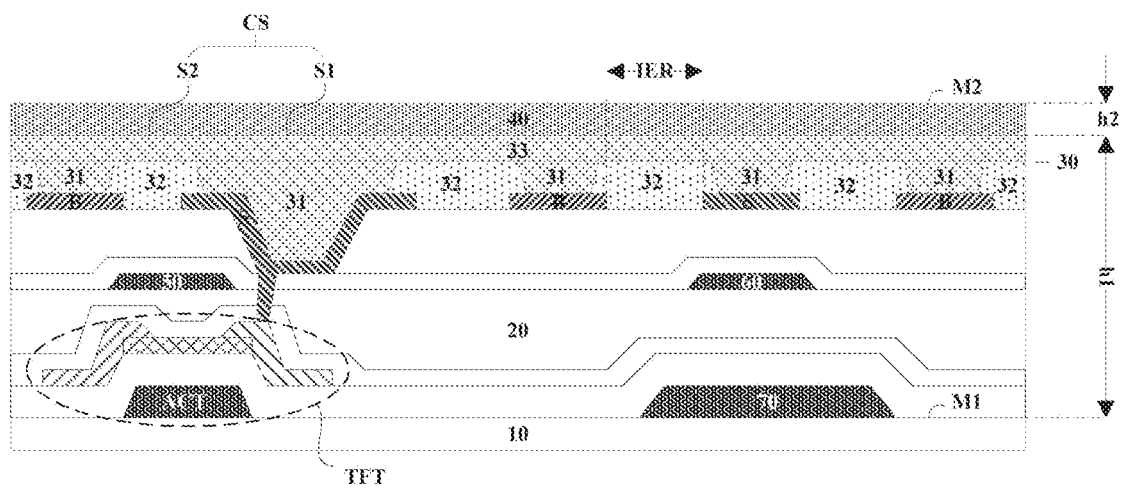
FIG. 17 is a cross-sectional view of a pixel of a radiation detector in some embodiments according to the present disclosure.

FIG. 17 is a cross-sectional view of a pixel of a radiation detector in some embodiments according to the present disclosure. Referring to FIG. 17, in some embodiments, the passivation layer further includes a third portion 33 on a side of the first portion 31 and the second portion 32 away from the base substrate 10. The third portion 33 is in direct contact with the radiation detection layer 40. Optionally, the third portion 33 and the first portion 31 are made of a same material and formed in a same process. Optionally, the third portion 33 and the first portion 31 are parts of a unitary structure.

In some embodiments, the third portion 33 has a substantially flat contacting surface in direct contact with the radiation detection layer. As used herein, the term "substantially flat contacting surface" refers to a flat surface (for example, entirely planar across the surface or a surface having micro-irregularities (for example, minor variations and/or deviations from flat surface geometries). Optionally, the deviation from the flat surface geometries is no more than 100 nm (e.g., no more than 90 nm, no more than 80 nm, no more than 70 nm, no more than 60 nm, no more than 50 nm, no more than 40 nm, no more than 30 nm, no more than 20 nm, no more than 10 nm, no more than 5 nm, or no more than 1 nm). Optionally, the deviation from the flat surface geometries is no more than 20 nm.

In another aspect, the present disclosure provides a method of fabricating a radiation detector having a plurality of pixels. In some embodiments, forming a respective one of the plurality of pixels includes forming a thin film transistor on a base substrate; forming an inter-layer dielectric layer on a side of the thin film transistor away from the base substrate; forming a sensing electrode and a bias electrode on a side of the inter-layer dielectric layer away from the base substrate, wherein the sensing electrode extends through the inter-layer dielectric layer to electrically connect to the thin film transistor; forming a passivation layer on a side of the sensing electrode and the bias electrode away from the inter-layer dielectric layer, wherein forming the passivation layer comprises forming a first portion and forming a second portion; and forming a radiation detection layer on a side of the passivation layer away from the base substrate. Optionally, the radiation detection layer is in direct contact with the first portion and in direct contact with the second portion. Optionally, the first portion comprises a first insulating material; the second portion comprises a second insulating material different from the first insulating material. Optionally, a first surface of the first portion away from the base substrate and a second surface of the second portion away from the base substrate are substantially co-planar, forming a substantially flat contacting surface in direct contact with the radiation detection layer.

Figure 18A:
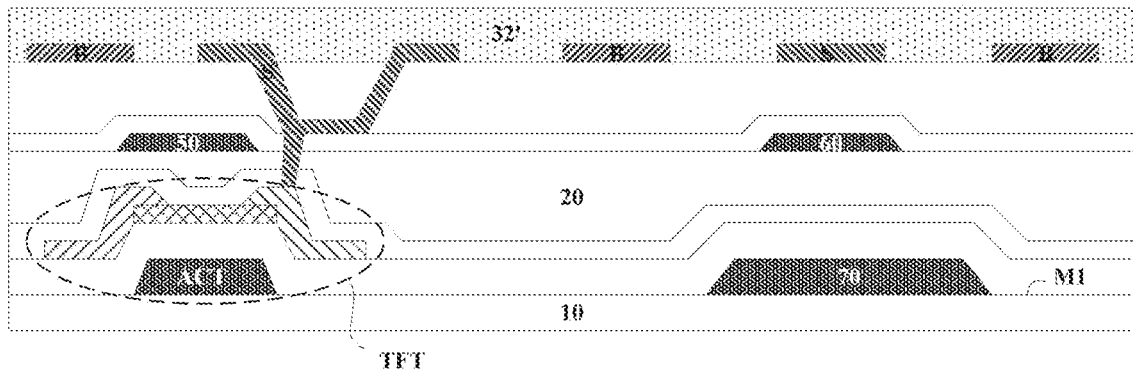
FIGS. 18A to 18E illustrate a method of fabricating a radiation detector in some embodiments according to the present disclosure.
Figure 18B:
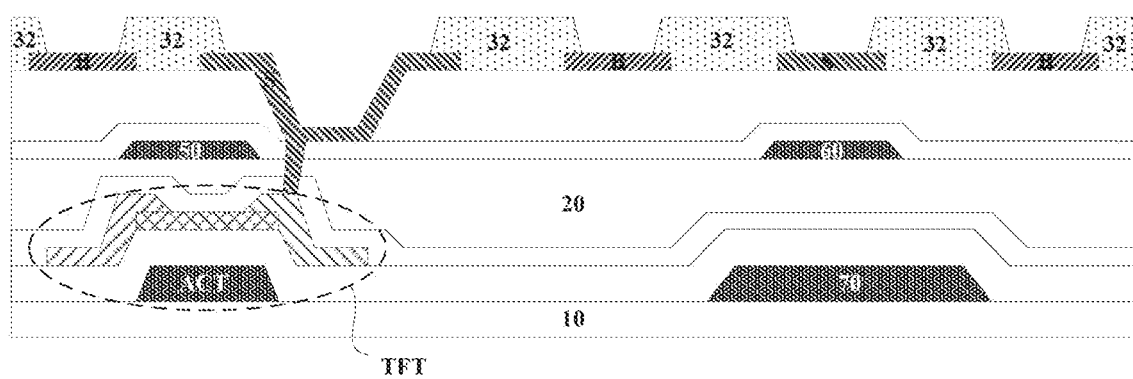

FIGS. 18A to 18E illustrate a method of fabricating a radiation detector in some embodiments according to the present disclosure. Referring to FIG. 18A, a second insulating material layer 32' is formed on a side of the sensing electrode S and the bias electrode B away from the base substrate 10. Referring to FIG. 18B, the second insulating material layer 32' is patterned to form the second portion 32, wherein a portion of the second insulating material layer 32' is removed during patterning to expose a surface of the sensing electrode S and a surface of the bias electrode B. Referring to FIGS. 18A and 18B, the portion of the second insulating material layer 32' respectively corresponding to a non-edge portion of the sensing electrode S substantially surrounded by the edge portion of the sensing electrode S. and a non-edge portion of the bias electrode B substantially surrounded by the edge portion of the bias electrode B, is removed during patterning the second insulating material layer 32'.

Figure 18C:
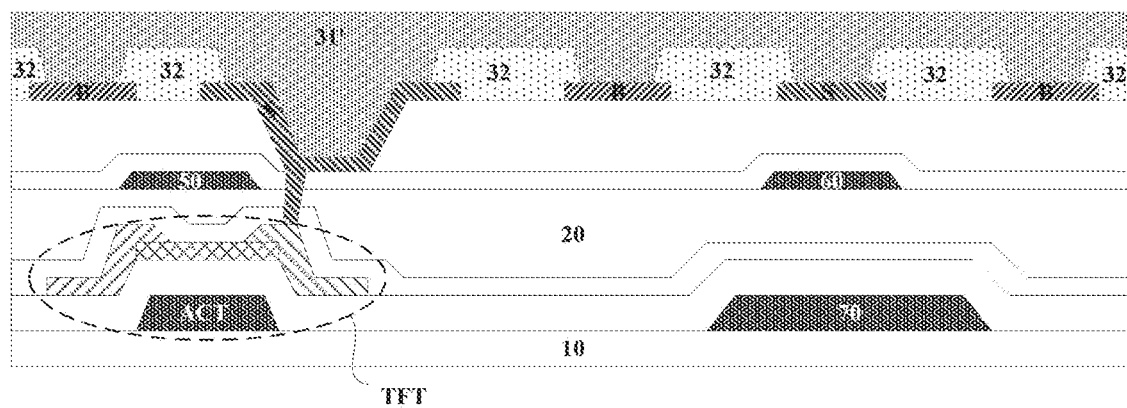
Figure 18D:
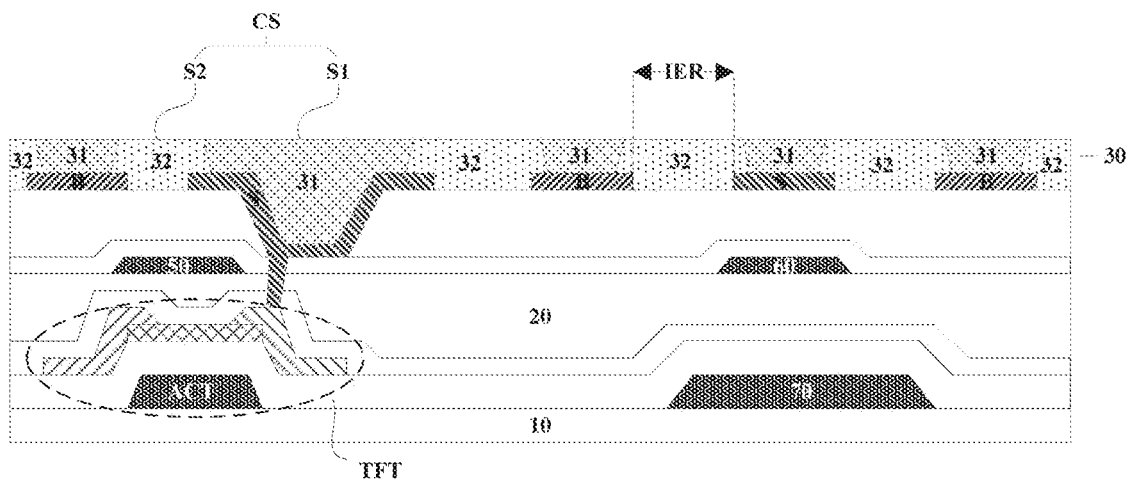

Referring to FIG. 18C, subsequent to forming the second portion 32, a first insulating material layer 31' is formed on a side of the second portion 32 away from the base substrate 10 and covering the surface of the sensing electrode S and the surface of the bias electrode B exposed during patterning of the second insulating material layer. The first insulating material layer 31' is formed to have a thickness greater than a thickness of the second portion 32. Referring to FIG. 18C and FIG. 18D, a thickness of the first insulating material layer 31' is then reduced to form the first portion 31. Optionally, the thickness of the first insulating material layer 31' is reduced so that a first surface S1 of the first portion 31 away from the base substrate 10 and a second surface S2 of the second portion 32 away from the base substrate 10 are substantially co-planar, forming the substantially flat contacting surface CS, thereby forming a passivation layer 30.

Referring to FIG. 18D, the second portion 32 is formed to cover an edge portion of the sensing electrode S, an edge portion of the bias electrode B, and an inter-electrode region IER between the sensing electrode S and the bias electrode B.

Figure 18E:
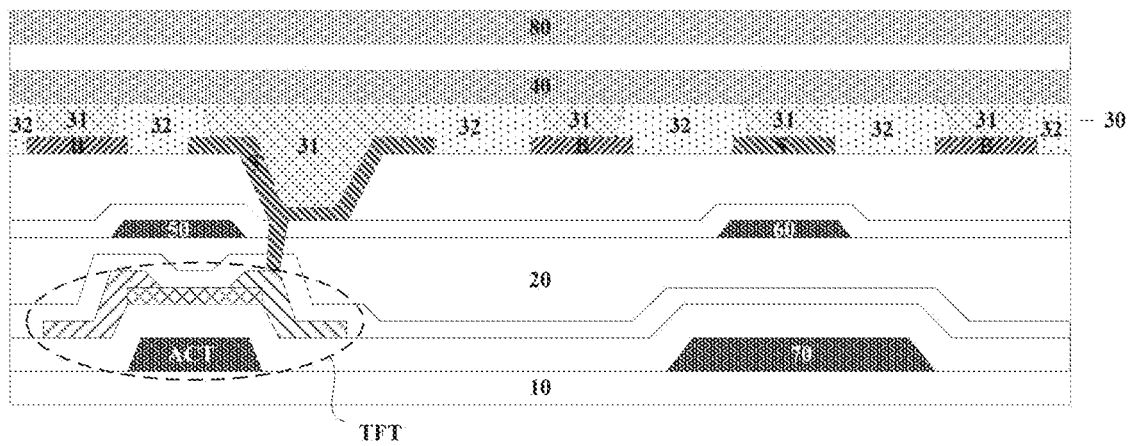

Referring to FIG. 18E, subsequently, a radiation detection layer 40 is formed on a side of the passivation layer 30 away from the base substrate 10. Optionally, the radiation detection layer 40 is formed to be in direct contact with the substantially flat contacting surface CS of the passivation layer 30.

Referring to FIG. 13, in some embodiments, the step of forming the sensing electrode S and the bias electrode B includes forming a conductive material layer on the inter-layer dielectric layer; and patterning the conductive material layer using a single mask plate to form interdigitated electrodes including the sensing electrode S and the bias electrode B. Optionally, branches of the sensing electrode 5 and the bias electrode B are alternately arranged. Optionally, forming the conductive material layer includes depositing a conductive material on the inter-layer dielectric layer to a thickness along a direction from the inter-layer dielectric layer to the base substrate greater than 75 nm.

Referring to FIG. 18E, subsequently, a scintillation layer 80 is formed on a side of the radiation detection layer 40 away from the base substrate 10. As used herein, the term "scintillator layer" refers to a functional layer in a radiation detector which is configured to convert radiation into light. Optionally, the scintillator layer 80 is a luminescent layer comprising a luminescent material. In some embodiments, the radiation detector further includes a radiation source for generating radiation, such as an X-ray or gamma ray. The radiation detector includes a plurality of pixels, e.g., photosensitive pixels for sensing radiation. The scintillator layer 80 converts radiation to light, and the radiation detection layer 40 converts light to electrical charges. Based on the electrical charges, the radiation detector outputs a detection signal corresponding to the amount of radiation in each pixel.

Any appropriate scintillator materials may be used for making the scintillator layer 80. In some embodiments, the scintillator material is a light wavelength conversion material that converts radiation (e.g., X-ray) to visible light. Examples of scintillator materials include, but are not limited to, cesium iodide activated by thallium (CsI(Tl)), cesium iodide activated by sodium CsI(Na)), sodium iodide activated by thallium (NaI(Tl)), zinc sulfide or zinc oxide (ZnS or ZnO), yttrium aluminum perovskite activated by cerium (YAP(Ce)), yittrium aluminum garnet activated by cerium (YAG(Ce), bismuth germinate (BGO), calcium fluoride activated by europium (CaF(Eu)), lutetium aluminum garnet activated by cerium (LuAG(Ce)), gadolinium silicate doped with cerium (GSO), cadmium tungstate (CdWO4; CWO), lead tungstate (PbWO4; PWO), double tungstate of sodium and bismuth (NaBi(WO4)2; NBWO), zinc selenide doped with tellurium (ZnSe(Te)), lanthanum bromide activated by cerium (LaBr3(Ce)), cerium bromide (CeBr3), lanthanum chloride activated by cerium (LaCl3(Ce)), or a combination thereof. Optionally, the scintillator material is cesium iodide activated by thallium (CsI(Tl)). Optionally, the scintillator layer 80 has a thickness in the range of approximately 400 µm to approximately 1000 µm.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A radiation detector having a plurality of pixels, wherein a respective one of the plurality of pixels comprises:
   a thin film transistor on a base substrate;
   an inter-layer dielectric layer on a side of the thin film transistor away from the base substrate;
   a sensing electrode and a bias electrode on a side of the inter-layer dielectric layer away from the base substrate, wherein the sensing electrode extends through the inter-layer dielectric layer to electrically connect to the thin film transistor;
   a passivation layer on a side of the sensing electrode and the bias electrode away from the inter-layer dielectric layer, wherein the passivation layer comprises a first portion and a second portion; and
   a radiation detection layer on a side of the passivation layer away from the base substrate;
   wherein the first portion comprises a first insulating material;
   the second portion comprises a second insulating material different from the first insulating material;
   the second insulating material covers an edge portion of the sensing electrode and covers an edge portion of the bias electrode;
   the first insulating material covers a non-edge portion of the sensing electrode surrounded by the edge portion of the sensing electrode and covers a non-edge portion of the bias electrode surrounded by the edge portion of the bias electrode; and the first insulating material is not in direct contact with the edge portion of the sensing electrode and the edge portion of the bias electrode.

2. The radiation detector of claim 1, wherein an entirety of a first surface of the first insulating material and a second surface of the second insulating material away from the base substrate shares a same common plane or being offset by no more than 50 nm.

3. The radiation detector of claim 1, wherein the first portion and the second portion are complementary to each other.

4. The radiation detector of claim 3, wherein a cross-section of a part of the first insulating material along a plane perpendicular to the base substrate and the radiation detection layer has a shape having one pair of substantially parallel sides and one pair of substantially non-parallel sides; and
a cross-section of a part of the second insulating material along the plane perpendicular to the base substrate and the radiation detection layer has a shape having one pair of substantially parallel sides and one pair of substantially non-parallel sides.

5. The radiation detector of claim 1, wherein the first insulating material is an organic polymer insulating material; and
the second insulating material is an inorganic insulating material.

6. The radiation detector of claim 1, wherein
a height of an entirety of a first surface of the first insulating material and an entirety of a second surface of the second insulating material away from the base substrate relative to the base substrate is substantially-uniform.

7. The radiation detector of claim 1, wherein an orthographic projection of the first insulating material on the base substrate at least partially overlaps with an orthographic projection of the sensing electrode on the base substrate and at least partially overlaps with an orthographic projection of the bias electrode on the base substrate.

8. The radiation detector of claim 1, wherein an orthographic projection of the second insulating material on the base substrate completely covers an orthographic projection of the sensing electrode on the base substrate and completely covers an orthographic projection of the bias electrode on the base substrate;
the bias electrode is spaced apart from the first portion by the second portion; and
the sensing electrode is spaced apart from the first portion by the second portion.

9. The radiation detector of claim 1, wherein the second insulating material covers an inter-electrode region between the sensing electrode and the bias electrode.

10. The radiation detector of claim 1, wherein the sensing electrode and the bias electrode are interdigitated electrodes;
branches of the sensing electrode and the bias electrode are alternately arranged;
the first portion comprises interdigitated branches;
orthographic projections of the sensing electrode and the bias electrode on the base substrate cover an orthographic projection of the first portion on the base substrate; and
the second portion covers an inter-electrode region between interdigitated branches of the first portion.

11. The radiation detector of claim 1, wherein the radiation detection layer is in direct contact with the first insulating material and in direct contact with the second insulating material; and an entirety of a combination of a first surface of the first insulating material away from the base substrate and a second surface of the second insulating material away from the base substrate shares a same common plane or being offset by no more than 50 nm, forming a contacting surface in direct contact with the radiation detection layer.

12. The radiation detector of claim 1, wherein the passivation layer further comprises a third portion on a side of the first portion and the second portion away from the base substrate; and
the third portion is in direct contact with the radiation detection layer.

13. The radiation detector of claim 1, wherein the sensing electrode and the bias electrode have a thickness along a direction from the base substrate to the radiation detection layer greater than 75 nm.

14. The radiation detector of claim 1, wherein the first portion and the second portion has a thickness along a direction from the base substrate to the radiation detection layer in a range of 100 nm to 300 nm.

15. A method of fabricating a radiation detector having a plurality of pixels, wherein forming a respective one of the plurality of pixels comprises:
forming a thin film transistor on a base substrate;
forming an inter-layer dielectric layer on a side of the thin film transistor away from the base substrate;
forming a sensing electrode and a bias electrode on a side of the inter-layer dielectric layer away from the base substrate, wherein the sensing electrode extends through the inter-layer dielectric layer to electrically connect to the thin film transistor;
forming a passivation layer on a side of the sensing electrode and the bias electrode away from the inter-layer dielectric layer, wherein forming the passivation layer comprises forming a first portion and forming a second portion; and
forming a radiation detection layer on a side of the passivation layer away from the base substrate;
wherein the first portion comprises a first insulating material;
the second portion comprises a second insulating material different from the first insulating material;
the second insulating material covers an edge portion of the sensing electrode and covers an edge portion of the bias electrode;
the first insulating material covers a non-edge portion of the sensing electrode surrounded by the edge portion of the sensing electrode and covers a non-edge portion of the bias electrode surrounded by the edge portion of the bias electrode; and
the first insulating material is not in direct contact with the edge portion of the sensing electrode and the edge portion of the bias electrode.

16. The method of claim 15, wherein forming the passivation layer comprises:
forming a second insulating material layer on a side of the sensing electrode and the bias electrode away from the base substrate;
patterning the second insulating material layer to form the second portion, wherein a portion of the second insulating material layer is removed during patterning to expose a surface of the sensing electrode and a surface of the bias electrode; and
forming a first insulating material layer on a side of the second portion away from the base substrate and covering the surface of the sensing electrode and the surface of the bias electrode exposed during patterning.

17. The method of claim 16, further comprising reducing a thickness of the first insulating material layer to form the first portion.

18. The method of claim 17, wherein reducing the thickness of the first insulating material layer is performed so that an entirety of a combination of a first surface of the first insulating material away from the base substrate and a second surface of the second insulating material away from the base substrate shares a same common plane or being offset by no more than 50 nm, forming a contacting surface in direct contact with the radiation detection layer.

19. The method of claim 18, wherein the second portion is formed to cover an edge portion of the sensing electrode, an edge portion of the bias electrode, and an inter-electrode region between the sensing electrode and the bias electrode; and the portion of the second insulating material layer respectively corresponding to a non-edge portion of the sensing electrode surrounded by the edge portion of the sensing electrode, and a non-edge portion of the bias electrode surrounded by the edge portion of the bias electrode, is removed during patterning.

20. The method of claim 15, wherein forming the sensing electrode and the bias electrode comprises:

forming a conductive material layer on the inter-layer dielectric layer; and patterning the conductive material layer using a single mask plate to form interdigitated electrodes comprising the sensing electrode and the bias electrode;

wherein branches of the sensing electrode and the bias electrode are alternately arranged; and forming the conductive material layer comprises depositing a conductive material on the inter-layer dielectric layer to a thickness along a direction from the inter-layer dielectric layer to the base substrate greater than 75 nm.

* * * * *